(12) United States Patent
Benzel et al.

(10) Patent No.: US 7,368,313 B2
(45) Date of Patent: May 6, 2008

(54) METHOD OF MAKING A DIFFERENTIAL PRESSURE SENSOR

(75) Inventors: Hubert Benzel, Pliezhausen (DE); Gerhard Lammel, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 332 days.

(21) Appl. No.: 11/053,115

(22) Filed: Feb. 7, 2005

(65) Prior Publication Data
US 2005/0199973 A1 Sep. 15, 2005

(30) Foreign Application Priority Data
Feb. 17, 2004 (DE) .................. 10 2004 007 519
Jul. 28, 2004 (DE) .................. 10 2004 015 444

(51) Int. Cl.
*H01L 29/04* (2006.01)
(52) U.S. Cl. ............. 438/52; 438/53; 438/51; 438/50; 438/E23.018
(58) Field of Classification Search ......... 438/48–53, 438/22–23
See application file for complete search history.

(56) References Cited

U.S. PATENT DOCUMENTS

| 4,672,354 A | * | 6/1987 | Kurtz et al. ............... 338/4 |
| 4,784,721 A | * | 11/1988 | Holmen et al. ............ 216/2 |
| 5,320,705 A | * | 6/1994 | Fujii et al. ............... 438/51 |
| 5,357,808 A | * | 10/1994 | Fung et al. ............... 73/721 |
| 2004/0048430 A1 | * | 3/2004 | Benzel et al. ............ 438/200 |

FOREIGN PATENT DOCUMENTS

| DE | 100 32 579 | 1/2003 |
| DE | 101 38 759 | 3/2003 |

\* cited by examiner

*Primary Examiner*—Dung A. Le
(74) *Attorney, Agent, or Firm*—Kenyon & Kenyon LLP

(57) ABSTRACT

In a method for manufacturing a micromechanical semiconductor component, e.g., a pressure sensor, a locally limited, buried, and at least partially oxidized porous layer is produced in a semiconductor substrate. A cavity is subsequently produced in the semiconductor substrate from the back, directly underneath the porous first layer, using a trench etch process. The porous first layer is used as a stop layer for the trench. Thin diaphragms having a low thickness tolerance may thus be produced for differential pressure measurement.

7 Claims, 3 Drawing Sheets

METHOD OF MAKING A DIFFERENTIAL PRESSURE SENSOR

FIELD OF THE INVENTION

The present invention is directed to a micromechanical semiconductor component and a method for manufacturing a micromechanical component.

BACKGROUND INFORMATION

Semiconductor components, in particular diaphragm sensors and methods for manufacturing diaphragm sensors on the basis of semiconductor substrates, silicon wafers, for example, are known. A flat porous diaphragm area, for example, is placed on a semiconductor substrate as a substrate layer for sensor structures, and subsequently a clearance for insulating, e.g., thermally, the diaphragm is produced by removing the porous layer (sacrificial layer) underneath the diaphragm.

The conventional diaphragm sensors are mostly implemented as thin-layer diaphragm sensors. Initially layer systems having a thickness between tens of nanometers and a few µm are deposited onto a substrate, whereupon the substrate is removed in predefined areas to obtain unsupported diaphragm areas. Sensor structure elements may then be placed in the diaphragm center.

Another possibility for exposing the diaphragm is surface micromechanics, in which a sacrificial layer is normally used, which is applied to the front of a substrate prior to depositing the diaphragm. The sacrificial layer is then removed from the front of the sensor through openings in the diaphragm, whereby an unsupported structure is obtained. These surface micromechanical methods are relatively complex due to the need for separate sacrificial layers.

Published German Patent Application No. 100 32 579 describes a method for manufacturing a semiconductor component and a semiconductor component manufactured according to this method, in which a layer made of porous semiconductor substrate material is placed over a cavity. Two layers of different porosities are produced using appropriate etching parameters for producing the cavity. The first layer has a lower porosity, during a subsequent first heating step the porosity of the second layer increases during the heating step in such a way that a cavity is formed. A relatively thick epitaxial layer is grown as a second diaphragm layer at a higher heating temperature in a second process step on the first diaphragm layer thus formed from the first porous layer.

As an extension of the method described in German Patent Application No. 100 32 579, a thin epitaxial layer may also be grown during the first heating step to ensure that the porous first layer, which is used as the start layer for the epitaxial growth of the thick epitaxial layer, is completely closed. A lower growth rate at a lower temperature is preferably selected here compared to the subsequent deposition of the thick epitaxial layer.

The above-mentioned measures are used to simplify the structure of a surface micromechanical semiconductor component, because no additionally applied sacrificial layer is needed, and the diaphragm itself or a substantial portion of the diaphragm is produced from semiconductor material.

To prevent damage to the diaphragm during the manufacturing process or during regular use, published German Patent Application No. 101 38 759 provides a method for manufacturing a semiconductor component having a semiconductor substrate, in which the semiconductor substrate receives a type of doping in the area of the porous diaphragm layer that is different from that in the area of the future cavity. After doping, the semiconductor material of the diaphragm layer is made porous and the semiconductor material underneath the porous semiconductor material is at least partially removed or displaced to provide a cavity.

German Patent Application No. 103 58 859 describes a method which is an extension of the method described in published German Patent Application No. 101 38 759. As described in German Patent Application No. 103 58 859, a porous layer is produced underneath areas of non-porous semiconductor material. An epitaxial step is subsequently carried out, in which an epitaxial layer, which forms the future diaphragm, closes the surface starting at the non-porous areas. Finally, a cavity is produced from the porous layer using a thermal treatment.

SUMMARY

The present invention provides a method for manufacturing a micromechanical semiconductor component, e.g., a pressure sensor, in which method a locally limited, buried, and at least partially oxidized porous layer is produced in a semiconductor substrate for manufacturing the semiconductor component. This porous oxide layer is manufactured by producing a porous first layer on the front of the semiconductor substrate with subsequent, at least partial, oxidation of the porous first layer. In an additional method step, an epitaxial layer is applied to the porous first layer; the epitaxial layer is also deposited onto at least part of the semiconductor substrate adjoining the porous first layer. The oxide on the surface of the first porous layer is removed to allow the epitaxial layer to grow on the porous first layer. A cavity is then produced in the semiconductor substrate from the back, directly underneath the porous first layer, using a trench etch process. In accordance with the present invention, the porous first layer is used as a stop layer for the trench. Thin diaphragms having a low thickness tolerance may thus be produced for differential pressure measurement.

Particularly advantageous is the production of the cavity using the trench etch process starting from the back of the semiconductor substrate. The buried and oxidized porous layer may be used as an etch stop layer for the trench etch process. The removal of the etch stop layer may be avoided by using the oxidized porous first layer as a diaphragm layer or part of the diaphragm layer. In addition to reducing costs, this also simplifies the manufacturing process, because no method steps for removing the etch stop material are needed.

In another example embodiment of the present invention, the lateral dimension of the porous first layer is greater than the lateral dimension of the cavity. Etching through the semiconductor substrate in the trench etch process may thus be avoided. This results in a stable attachment of the diaphragm. The lateral tolerances in trench etching may be compensated.

The trench etch process starting from the back of the semiconductor substrate may be advantageously controlled by the flanks of the cavity having a negative flank angle, for example. Micropassivation by oxygen precipitates, for example, is thus prevented.

To stabilize the porous first layer, for example, against moisture or to protect the back side of the diaphragm against aggressive media, an additional layer may be advantageously applied to the cavity flanks, the (oxidized) porous first layer, and/or on the back of the semiconductor substrate. This may be a nitride layer, for example, which seals, i.e., passivates, the surface.

In another example embodiment of the present invention, at least one piezoelectric resistor and/or part of an analyzer circuit is produced on the front of the semiconductor substrate. In this example embodiment, the piezoelectric resistor and/or part of the analyzer circuits are produced from or in the epitaxial layer.

A silicon substrate is provided as an example of the semiconductor substrate. It is furthermore conceivable to implement the epitaxial layer via a monocrystalline semiconductor layer. In an example embodiment of the present invention, the porous first layer is produced by anodization, the first porous layer being oxidized using thermal oxidation, for example.

BRIEF DESCRIPTION OF THE DRAWINGS

FIGS. 2a through 2d show various steps of an example method for manufacturing the pressure sensor according to the present invention.

DETAILED DESCRIPTION

Figure 1:
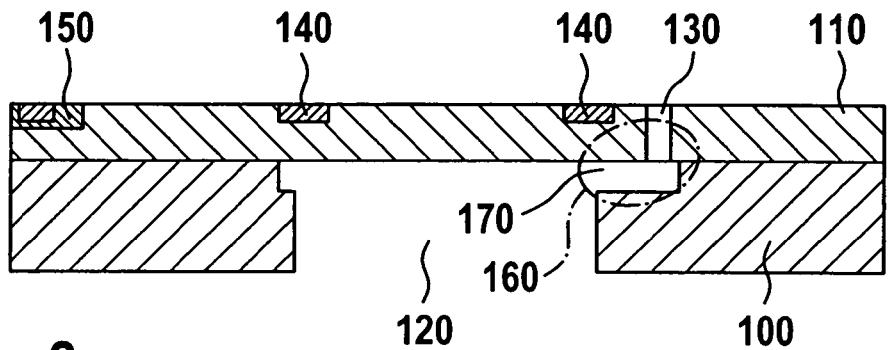
FIG. 1 schematically shows a conventional differential pressure sensor.
Figure 1:
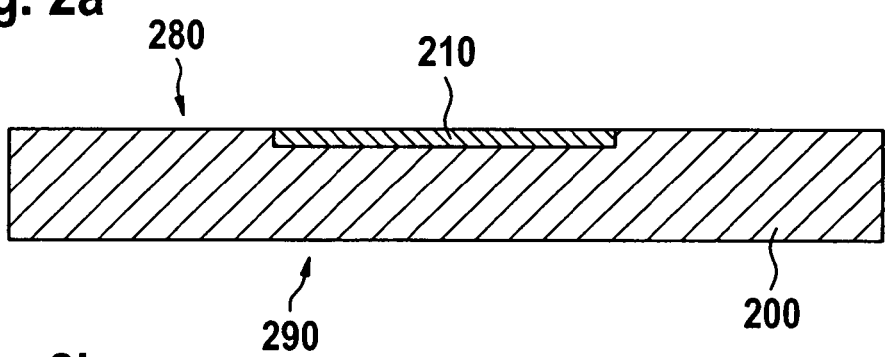
Figure 1:
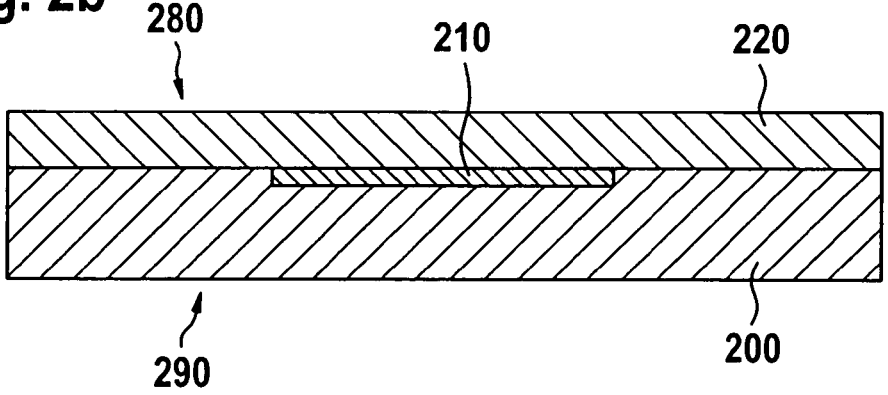
Figure 1:
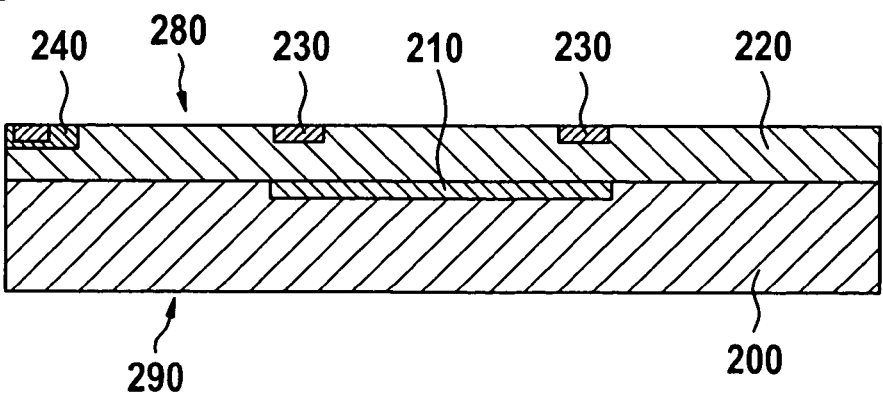

FIG. 1 illustrates a conventional micromechanical pressure sensor known in the art. An epitaxial layer 110, which forms a diaphragm over a cavity 120, is applied to a semiconductor substrate 100. Piezosensitive resistors 140, which convert the movement of the diaphragm in the event of a pressure difference between the medium in cavity 120 and the outside into a detectable pressure quantity, are applied to epitaxial layer 110. In addition, at least part of an analyzer circuit 150 for processing the pressure quantity may be mounted on epitaxial layer 110. Normally, part of cavity 120 is produced via a porous layer which, in the subsequent manufacturing process, is removed from the front of the pressure sensor through an appropriate access opening 130. In such a manufacturing process, in the subsequent trench opening from the back of the substrate, a circumferential gap 170 is formed at the level of the original porous layer as illustrated by area 160 in FIG. 1. When using such a pressure sensor, particles contained in the medium may get into the gap (in area 160) and settle there, resulting in a (negative) effect on the sensor signal, for example.

One possibility for eliminating the circumferential gap 170 is to have the lateral dimension of the trench opening larger than the oxidized porous layer used as an etch stop layer. In this case, however, attention must be paid to terminating the trench process after a defined time period to prevent the substrate, including semiconductor substrate 100 and epitaxial layer 220, from being etched through. The stop layer is subsequently dissolved and removed to produce the cavity. In this manufacturing process, the thickness of the stop layer must be sufficient to buffer the inhomogeneity of the trench process. Such a thick oxide layer (typically 30 µm) may, however, cause a problem in the epitaxial process.

In contrast, FIGS. 2a through 2d show a manufacturing process according to the present invention for a differential pressure sensor having a thin (typically 1 µm) oxidized porous layer as a trench stop, which is not to be dissolved. This manufacturing process makes it possible to avoid narrow gaps in the proximity of the fastening points of the diaphragm (cf., area 160 shown in FIG. 1). In addition, the size of the diaphragm is no longer defined by the dimension of the stop layer, but by the trench opening on the back.

Figure 2D:
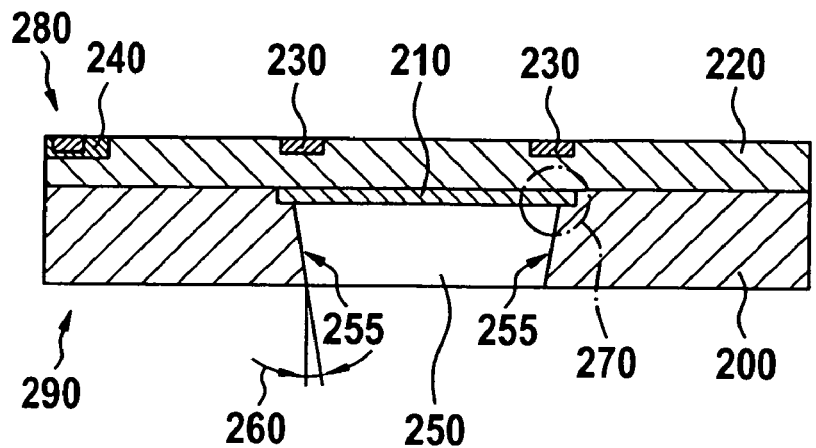

For example, according to FIG. 2a, an area 210 in a silicon substrate 200 is locally anodized using an appropriate mask on front 280 of silicon substrate 200. This area 210 defines the future maximum dimension of the diaphragm. Area 210 is etched by anodizing, making it porous and thus creating a porous layer. The silicon is then at least partially oxidized, e.g., by thermal oxidation. To make it possible to grow monocrystalline silicon both on the surface of untreated silicon substrate 200 and on porous oxidized silicon layer 210 in the subsequent epitaxial step, the surface of oxidized porous layer 210 is slightly etched using hydrofluoric acid (HF), for example. The oxide on the surface of oxidized porous layer 210 is etched by this type of treatment. Because the monocrystalline porous silicon is now exposed, a monocrystalline epitaxial layer 220 may be grown on silicon substrate 200, as shown in FIG. 2b. This monocrystalline epitaxial layer 220, together with at least part of porous layer 210, eventually forms the diaphragm. Piezosensitive resistors 230 and optional parts of the analyzer circuit or complete analyzer circuit 240 may be subsequently mounted onto or into the surface of epitaxial layer 220 using appropriate semiconductor processes, as shown in FIG. 2c. After completion of the semiconductor process, a cavity 250, which allows the medium to access the diaphragm, is produced using a trench process from back 290 of silicon substrate 200, as shown in FIG. 2d. The oxidized porous silicon is used as an etch stop and is on the entire diaphragm bottom and in the narrow gaps in the proximity of the fastening points of the diaphragm (see area 270 of FIG. 2d). This prevents particles from penetrating and becoming stuck during the operation of the pressure sensor. The sensor characteristic is therefore not affected.

The lateral tolerances in trench etching and their masking determine the position and size of the diaphragm. This ensures that the trench process stops at the diaphragm level. Etching through next to porous layer 210 is prevented. The positional and size tolerance of the diaphragm affects the position of the piezoelectric resistors regarding the diaphragm edge and therefore the sensitivity and offset of the output signal. Therefore, a sufficient surface area must be reserved for the analyzer circuit when planning the required dimensions.

Flank angle 260 shown in FIG. 2d may be selected to be slightly negative in the trench etch process. The trench opening in the proximity of the diaphragm thus becomes slightly larger; however, this enlargement may be reserved, i.e., taken into account by appropriate masking. The advantage of a negative flank angle is that micropassivation in trenching is prevented. Minute defects in the crystal, for example, oxygen precipitates, are thus underetched, so that a smooth surface is obtained on the trench bottom and on the diaphragm back.

Figure 3:
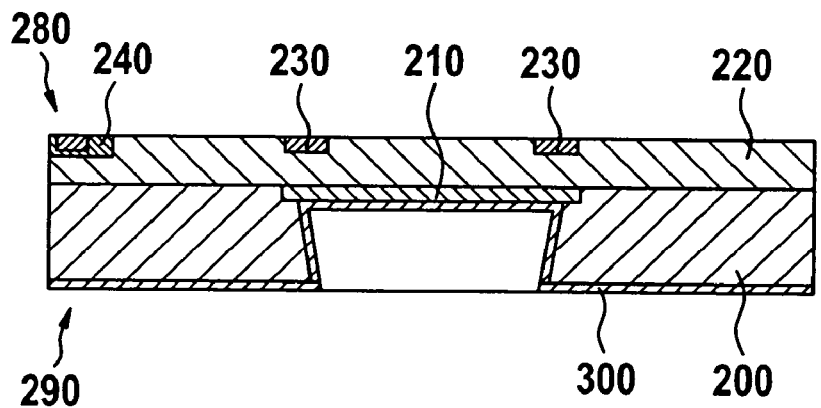
FIG. 3 shows an example embodiment of the pressure sensor manufactured using an example manufacturing method according to the present invention.

FIG. 3 shows another embodiment of the present invention in which a protective layer 300 has been applied to the back of the diaphragm, i.e., on porous silicon oxide layer 210. This protective layer 300 may passivate the diaphragm back against aggressive media. Furthermore, protective layer 300 may protect oxidized porous layer 210 against moisture. Optionally, in addition to the diaphragm back, cavity flanks 255 and substrate back 290 may also be covered. A nitride layer has proven to be a particularly effective protective layer 300; protective layers of silicon carbide, silane or Teflon layers may also be used. In addition, the use of hexamethyldisilazane (HMDS) and hexamethyldisiloxane (HMOS-N) as protective layer 300 is also conceivable. A protective layer 300 such as shown in FIG. 3 is, however, optional, because, in general, applications of the differential pressure sensor in non-aggressive media are also conceivable.

Figure 4:
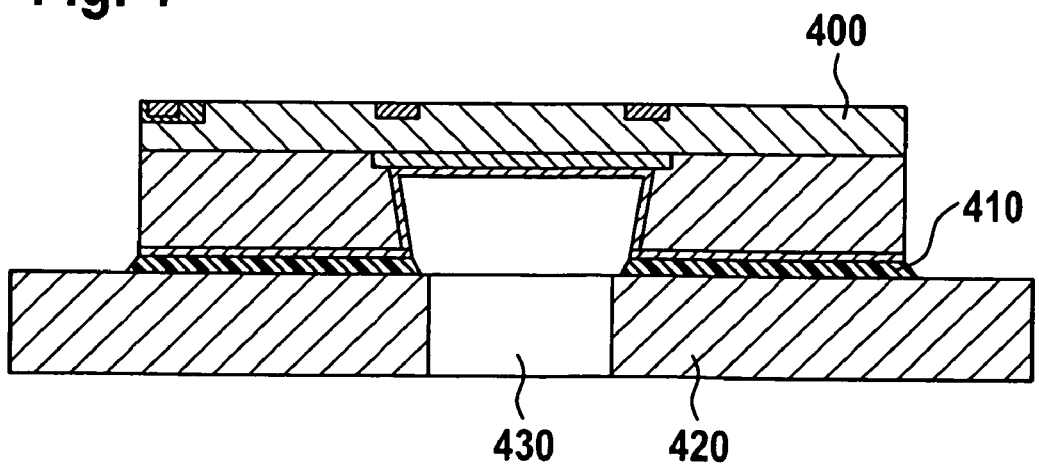
FIG. 4 shows an example application of a pressure sensor according to the present invention.

FIG. 4 shows an example application of an embodiment of a differential pressure sensor according to the present invention. A semiconductor component including finished semiconductor substrate 200, epitaxial layer 220, and a protective layer 300 is mounted onto a support 420. The component is attached to the support using an appropriate glue 410. An opening 430 through which the medium may be supplied to cavity 250 of the semiconductor component is provided in support 420. A pressure difference between the medium in the cavity and the medium outside the semiconductor component may thus be measured.

Instead of a simple support 420, in a further example embodiment of the present invention, the semiconductor component may also be anodically bonded to a perforated glass plate. A bore hole is used as an opening for supplying pressure into the cavity, i.e., to the diaphragm. The glass plate or glass base may be glued or soldered onto a metal base for further processing. In doing so, the opening in the glass base is advantageously covered with a layer made of a special coating material to seal micro cracks which would reduce the bursting strength of the sensor.

Figure 5A:
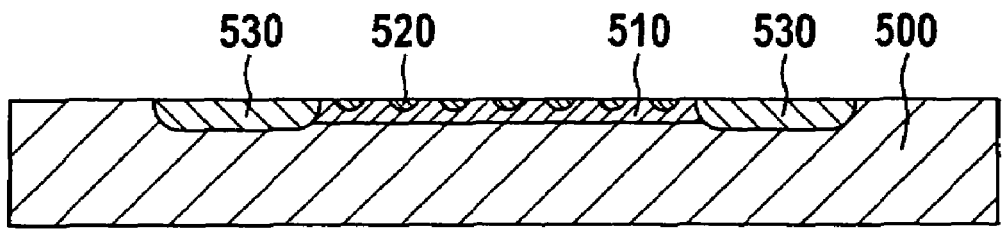
FIGS. 5a through 5c show various steps of another example method for manufacturing a pressure sensor according to the present invention.
Figure 5B:
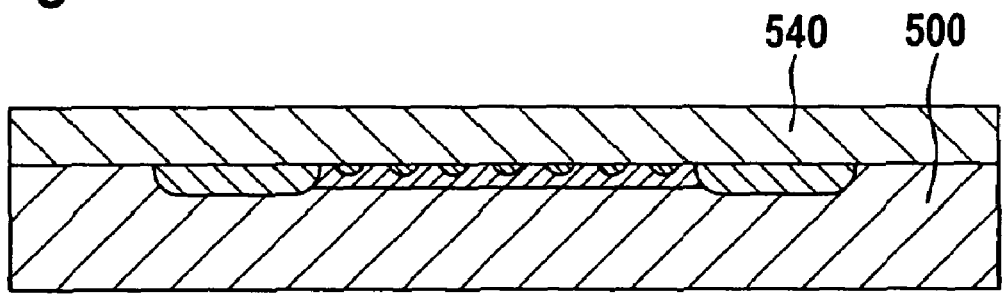
Figure 5C:
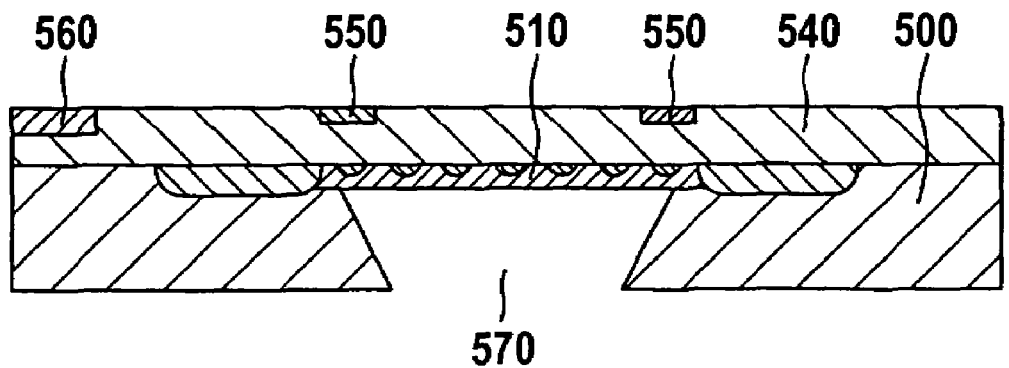

Another example embodiment according to the present invention is illustrated in FIGS. 5a-5c. The silicon of a silicon substrate 500 is etched in anodizing in the area of a grid-like n-doping 520 on the surface of the diaphragm so it does not become porous. The structure, i.e., epitaxial layer 540, deposited in a subsequent process step may be mechanically stabilized via grid-like structure 520 thus obtained, which may be framed, for example, by an also n-doped, non-porous etched area 530. The substrate surface and porous silicon 510 are oxidized in the subsequent thermal oxidation. To enable epitaxial layer 540 to grow on n-doped areas 520, i.e., on silicon substrate 500, in a further process step the oxidized porous silicon is etched on the surface to remove the oxide from the surface. One method of achieving such a surface etching of the oxide, for example, is a brief immersion in hydrofluoric acid (HF), known as an HF dip.

After this HF dip, in an epitaxial step, monocrystalline silicon may be grown as epitaxial layer 540 on the surface of silicon substrate 500 and n-doped areas 520. The small openings of the "n-type grid" in which there is oxidized porous silicon are overgrown, so that a monocrystalline epitaxial layer 540 is obtained, which later forms the diaphragm of the sensor.

Finally, the substrate thus manufactured, including silicon substrate 500 and epitaxial layer 540 as shown in FIG. 5b, may be equipped with piezoelectric elements 550 and circuit elements 560 before a trench process opens the diaphragm via an access channel 570 from the back of the diaphragm (FIG. 5c). As mentioned previously, the trench process stops at the oxidized porous layer, so that the pressure sensors may be manufactured to have diaphragms of the same thickness. A plurality of pressure sensors having a defined diaphragm thickness may thus be manufactured simultaneously on a single wafer using such a manufacturing process.

What is claimed is:

1. A method for manufacturing a micromechanical semiconductor component configured as a pressure sensor, the pressure sensor including a diaphragm layer, the method comprising:
   producing a porous first layer on a front surface of a semiconductor substrate;
   at least partially oxidizing the porous first layer;
   removing the oxide from the surface of the porous first layer;
   applying an epitaxial layer to the porous first layer and at least onto the area of the semiconductor substrate adjoining the porous first layer; and
   producing a cavity directly underneath the porous first layer in the semiconductor substrate using a trench etch process;
   wherein the porous first layer is at least a part of the diaphragm layer, and the lateral dimension of the porous first layer is greater than the lateral dimension of the cavity.

2. The method as recited in claim 1, wherein the trench etch process produces the cavity from a back surface of the semiconductor substrate, and wherein the porous first layer functions as an etch stop layer for the trench etch process.

3. The method as recited in claim 1, wherein the trench etch process produces negative flank angles of the cavity.

4. The method as recited in claim 1, further comprising:
   applying a passivating second layer onto at least one of the porous first layer and flanks of the cavity, wherein the passivating second layer is one of a nitride layer, a silicon carbide layer, a silane layer, a teflon layer, an HMDS layer, and an HMOS-N layer.

5. The method as recited in claim 3, further comprising:
   applying a passivating second layer onto at least one of the porous first layer and flanks of the cavity, wherein the passivating second layer is one of a nitride layer, a silicon carbide layer, a silane layer, a teflon layer, an HMDS layer, and an HMOS-N layer.

6. The method as recited in claim 1, further comprising:
   providing at least one of a piezoelectric resistor and a part of an analyzer circuit in the epitaxial layer.

7. The method as recited in claim 1, wherein at least one of: a) a silicon substrate is provided as the semiconductor substrate; b) a monocrystalline semiconductor layer is provided as the epitaxial layer; and c) the porous first layer at least one of has i) a thickness of a few μm, ii) is produced by anodizing, and iii) is oxidized by thermal oxidation.

* * * * *